United States Patent
Azuma

(10) Patent No.: US 9,154,121 B2
(45) Date of Patent: Oct. 6, 2015

(54) PULSE WIDTH MODULATION SIGNAL GENERATOR

(71) Applicant: KABUSHIKI KAISHA TOSHIBA, Tokyo (JP)

(72) Inventor: Tetsuhiko Azuma, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 14/015,997

(22) Filed: Aug. 30, 2013

(65) Prior Publication Data

US 2014/0266489 A1    Sep. 18, 2014

(30) Foreign Application Priority Data

Mar. 14, 2013  (JP) ................... 2013-052006

(51) Int. Cl.
| | |
|---|---|
| H03K 7/08 | (2006.01) |
| H03K 3/017 | (2006.01) |
| H03F 3/217 | (2006.01) |
| H03F 3/187 | (2006.01) |

(52) U.S. Cl.
CPC .................. *H03K 7/08* (2013.01); *H03F 3/187* (2013.01); *H03F 3/217* (2013.01); *H03K 3/017* (2013.01); *H03F 2200/351* (2013.01)

(58) Field of Classification Search
CPC .......... H03K 7/08; H03K 3/017; H03F 3/217; H03F 3/187; H03F 2200/351
USPC ............. 332/109; 363/41, 21.1, 21.11, 21.18, 363/26; 375/238; 370/205, 212
See application file for complete search history.

(56) References Cited

FOREIGN PATENT DOCUMENTS

| | | |
|---|---|---|
| JP | 07-028737 | 1/1995 |
| JP | 2010-056594 | 3/2010 |
| JP | 2010-245942 | 10/2010 |

*Primary Examiner* — Arnold Kinkead
*Assistant Examiner* — Richard Tan
(74) *Attorney, Agent, or Firm* — Patterson & Sheridan, LLP

(57) ABSTRACT

An embodiment of pulse width modulated (PWM) signal generator includes a module or modules to calculate an amount of change in a period length and duty ratio of an output signal during a transition period between a first signal waveform and a second signal waveform using a first period parameter, a second period parameter, and a parameter indicating a predetermined number of steps in the transition period. The period parameter and duty parameter of the output signal during the steps of the transition period are based on the calculated amounts of change.

20 Claims, 5 Drawing Sheets

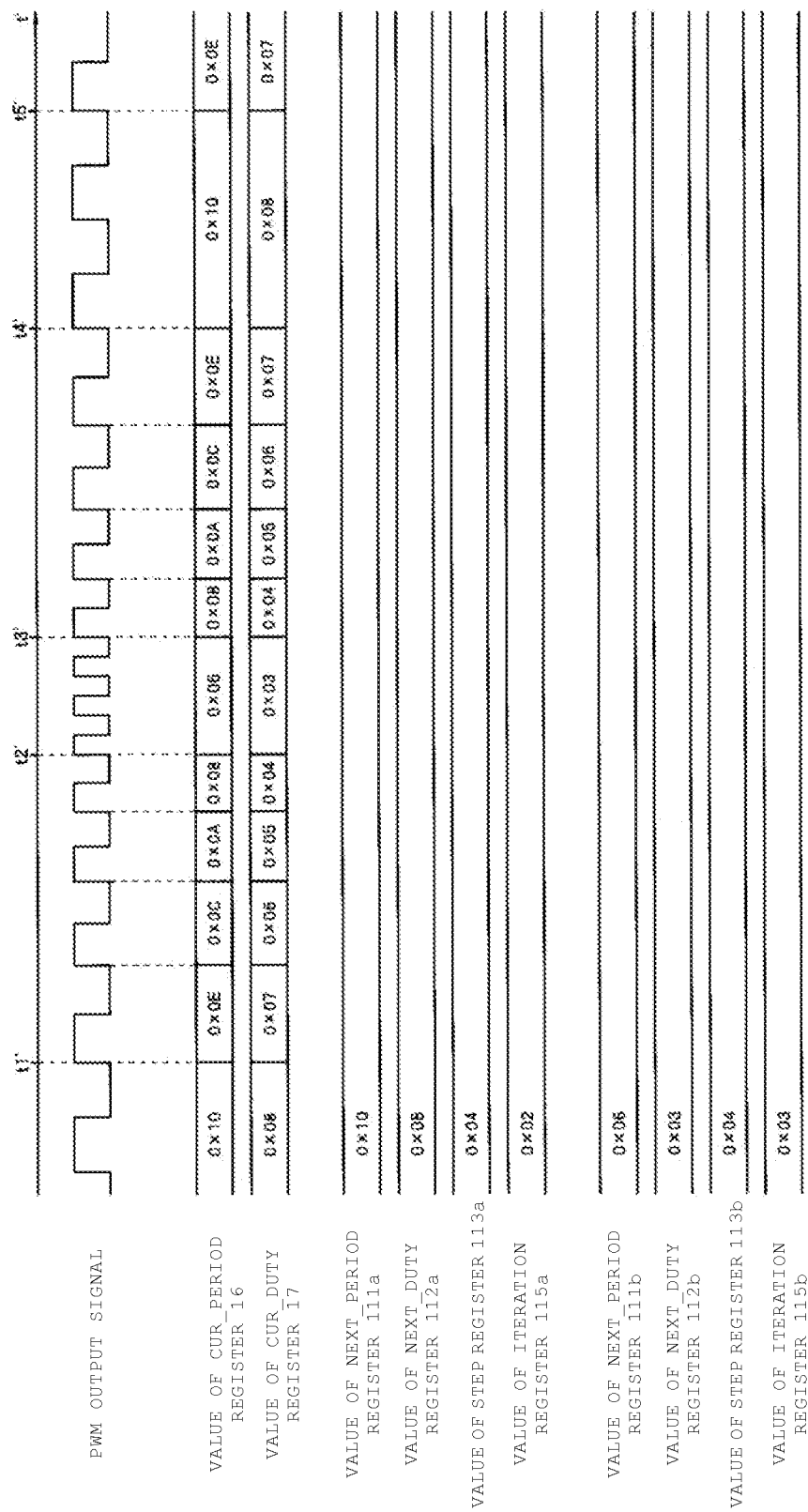

PULSE WIDTH MODULATION SIGNAL GENERATOR

CROSS-REFERENCE TO RELATED APPLICATION

This application is based upon and claims the benefit of priority from Japanese Patent Application No. 2013-052006, filed Mar. 14, 2013, the entire contents of which are incorporated herein by reference.

FIELD

The embodiment described herein relates generally to a pulse width modulation (PWM) signal generator.

BACKGROUND

Recently, a PWM signal has been broadly used in the dimming of backlights for liquid crystal panels or the controlling of the rotation speed of DC motors. For example, in the dimming of backlights for liquid crystal panels, the brightness is adjusted by controlling on time and off time of LED elements. Specifically, as the on time (lighting time) is lengthened, the backlights can be brightened, and as the off time is lengthened, the backlights can be dimmed.

The adjustment of lighting time and off time is controlled by changing the frequency or duty ratio (hereinafter, simply described as the duty) of the PWM signal. For example, the lighting time of the LED elements is lengthened by increasing the duty of the PWM signal, brightening the backlights. On the other hand, the lighting time of the LED elements is shortened (the off time is lengthened) by decreasing the duty of the PWM signal, dimming the backlights.

In case the dimming of the backlights or when the rotation speed of a DC motor is controlled, the on/off state is preferably slowly (smoothly) changed over time. For this purpose, a state value is changed stepwise until the frequency or duty of the PWM signal reaches a target value.

When the frequency or duty of the PWM signal is changed stepwise, appropriate values of the period and the duty are required to be set by a CPU for each step change. However, because the update frequency of the period or duty is high, the load of the CPU is large.

DESCRIPTION OF THE DRAWINGS

FIG. 5 is a timing chart depicting a relationship between a PWM output signal and the values stored in each register according to a second embodiment.

DETAILED DESCRIPTION

Figure 1:
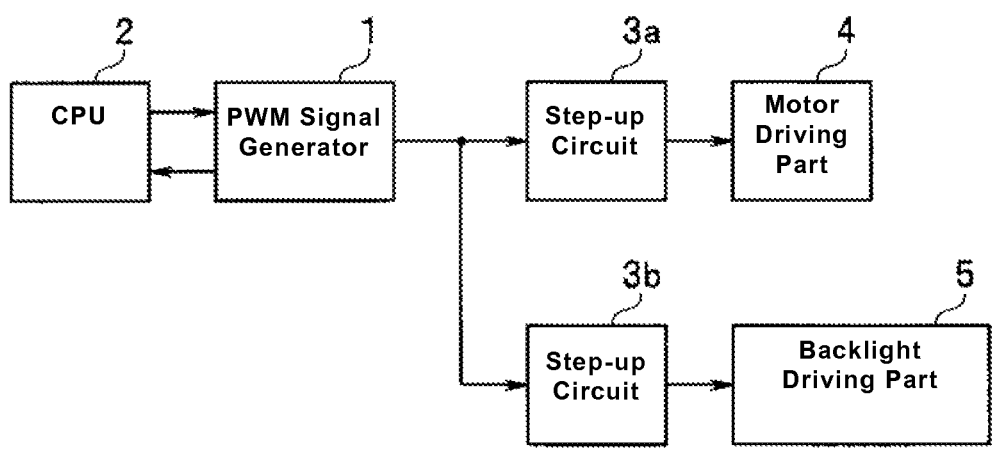
FIG. 1 is a diagram depicting a system with a PWM signal generator according to a first embodiment.

According to example embodiments, there is provided a PWM signal generator that can reduce the load of a CPU. Example embodiments will be explained with reference to the figures.

According to one embodiment, a pulse width modulated signal generator includes a period-change quantity-calculation module to calculate an amount of change in a period parameter of an output signal during a transition period between an output of a first signal waveform and an output of a second signal waveform. The calculation of the amount of change is made using a first period parameter (corresponding to a period length) of the first signal waveform, a second period parameter (corresponding to a period length) of the second signal waveform, and a transition-period parameter indicating a predetermined number of steps in the transition period—that is, the desired number of increments between the switch from the first signal waveform to the second signal waveform, or vice versa. A duty-change quantity-calculation module is included to calculate an amount of change in a duty ratio of the output signal during the transition period using a first duty parameter (corresponding to the duty ratio) of the first signal waveform, a second duty parameter (corresponding to the duty ratio) of the second signal waveform, and the transition-period parameter. A period-calculation module calculates the period parameter for the output signal for each step of the transition period using the calculated amount of change in the period parameter of the output signal. A duty-calculation module calculates the duty ratio for the output signal for each step of the transition period using the calculated amount of change in the duty ratio of the output signal.

According to another embodiment, a PWM signal generator includes a first period register and a first duty register for storing a first period and a first duty of a PWM signal with a first waveform; a second period register and a second duty register for storing a second period and a second duty of the PWM signal with a second waveform; a first transition-period register for storing a first transition period for transiting the waveform of the PWM signal from the second waveform to the first waveform; a second transition-period register for storing a second transition period for transiting the waveform of the PWM signal from the first waveform to the second waveform; a period-change quantity-calculation part calculating the amount of change of the period of the PWM signal in the first transition period or the second transition period using the first period, the second period, and the first transition period or the second transition period; a duty-change quantity-calculation part calculating the amount of change of the duty of the PWM signal in the first transition period or the second transition period using the first duty, the second duty, and the first transition period or the second transition period; a period-calculation part calculating the period using for the PWM signal that is next generated using the amount of change of the period in the first transition period and the second transition period; and a duty-calculation part calculating the duty using for the PWM signal that is next generated using the amount of change of the duty in the first transition period and the second transition period.

First Embodiment

FIG. 1 is a diagram depicting an example of a system using a PWM signal generator 1 according to a first embodiment. As shown in FIG. 1, a CPU 2 is connected to the PWM signal generator 1. Various parameters for generating a PWM signal are written to the PWM signal generator 1 from the CPU 2. An interrupt signal is output to the CPU 2 from the PWM signal generator 1. Here, a signal for indicating the PWM signal generator 1 is in a state in which it can receive various parameters is included in the interrupt signal.

A motor-driving part 4 or a backlight-driving part 5 is connected via step-up circuits 3a and 3b to the PWM signal generator 1. The backlight-driving part 5 may be used, for example, with a liquid crystal panel. In the PWM signal generator 1, the PWM signal generated according to various supplied parameters input from the CPU 2 is stepped up to a desired voltage level by the step-up circuits 3a and 3b and input into the motor-driving part 4 or the backlight-driving part 5. A motor (not shown in the figure) can be connected to the motor-driving part 4 and the rotation speed of the motor controlled using the input PWM signal. A backlight for a liquid crystal panel (not shown in the figure) can be connected to the backlight-driving part 5, and the brightness of the backlight is adjusted using the input PWM signal.

Figure 2:
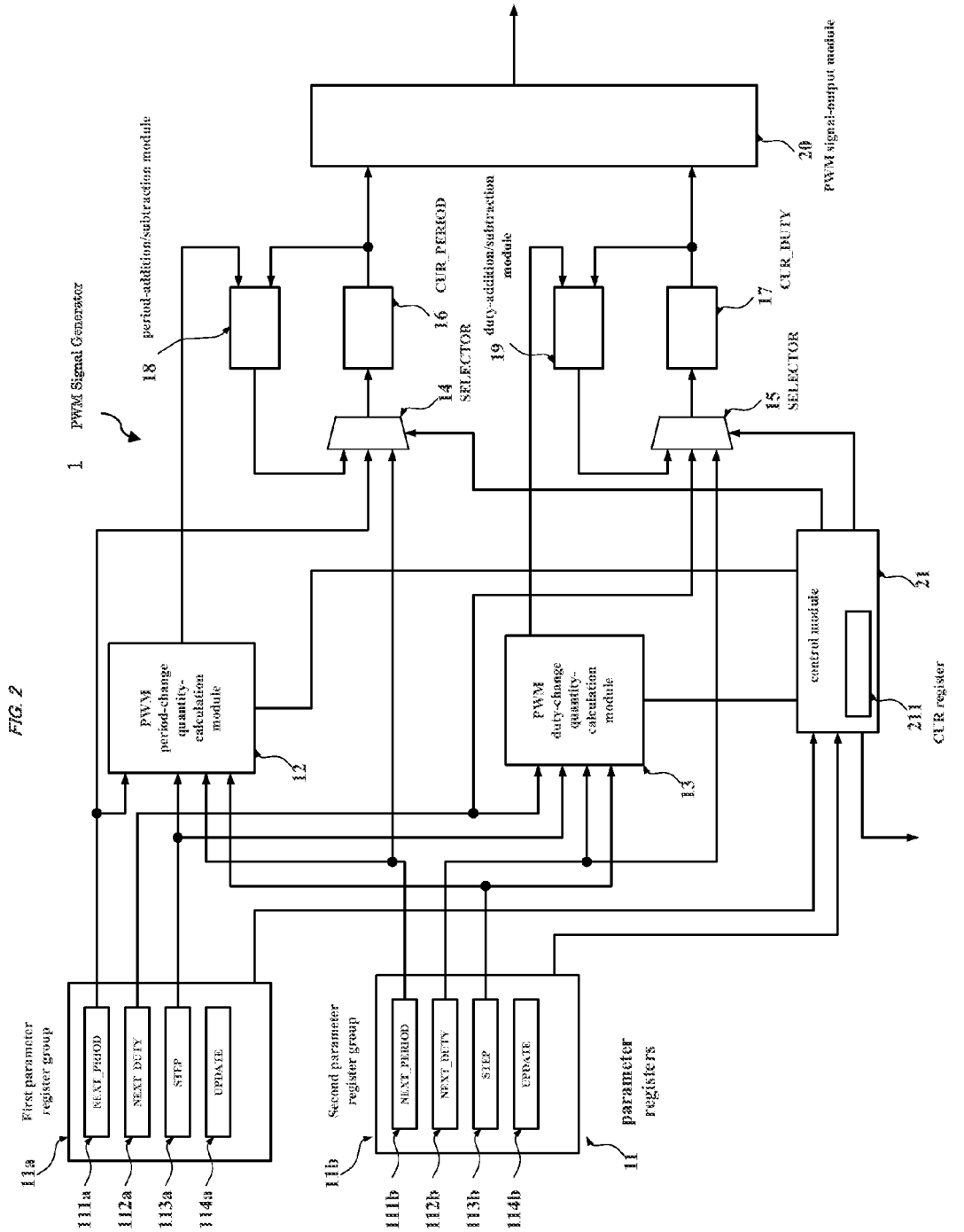
FIG. 2 is a block diagram depicting a configuration of a PWM signal generator according to a first embodiment.

Next, a configuration of the PWM signal generator 1 of this first embodiment will be explained with reference to FIG. 2. FIG. 2 is a block diagram depicting configuration of the PWM signal generator 2 according to the first embodiment.

In FIG. 2, the PWM signal generator 1 has a parameter-register 11 that stores various parameters for generating a PWM signal, a period-change quantity-calculation module 12, and a duty-change quantity-calculation module 13. The parameter-register 11 has a first parameter-register group 11a and a second parameter-register group 11b. The first parameter-register group 11a includes four registers of a NEXT_PERIOD register 111a as a first period register for storing the period information of the PWM signal, a NEXT_DUTY register 112a as a first duty register for storing the duty information of the PWM signal, a STEP register 113a as a first transition-period register for storing a transition frequency required from the present set value to a target set value, and an UPDATE register 114a as a first setup-completion flag showing a state as to whether the setup of the registers of the NEXT_PERIOD register 111a, the NEXT_DUTY register 112a, and the STEP register 113a is completed.

The second parameter-register group 11b also includes four registers in a manner similar to the first parameter-register group 11a. In other words, this parameter-register group 11b includes four registers: a NEXT_PERIOD register 111b as a second period register for the storing period information of the PWM signal, a NEXT_DUTY register 112b as a second duty register for storing the duty information of the PWM signal, a STEP register 113b as a second transition-period register for storing a transition frequency required from the present set value to a target set value, and an UPDATE register 114b as a second setup-completion flag showing a state as to whether the setup of the registers of the NEXT_PERIOD register 111b, the NEXT_DUTY register 112b, and the STEP register 113b is completed.

In the period-change quantity-calculation module 12, the amount of change in the period length per one period of the PWM signal waveform during the transition period of the PWM signal during which the parameters of the PWM signal are transitioned from the present set value to a target set value is calculated.

In addition, in the duty-change quantity-calculation module 13, the amount of change in the duty per one period during the transition period of the PWM signal during which the parameters of the PWM signal are transitioned from the present set value to a target set value is calculated.

The PWM signal generator 1 has a period-addition/subtraction module 18 for calculating the next period of the PWM signal to be used in generating a signal during the transition period according to the calculation result in the period-change quantity-calculation module 12, and a duty-addition/subtraction module 19 for calculating the next duty of the PWM signal to be used in generating a signal during the transition period according to the calculation result in the duty-change quantity-calculation module 13.

In addition, the PWM signal generator 1 also has a CUR_PERIOD register 16 in which a period that is used in the generation of the current PWM signal is stored, a CUR_DUTY register 17 in which a duty that is used in the generation of the current PWM signal is stored, and a PWM signal-output module 20 that generates and outputs the PWM signal using the values of the CUR_PERIOD register 16 and the CUR_DUTY register 17.

A value is set in the CUR_PERIOD register 16 via a selector 14. The NEXT_PERIOD register 111a, the NEXT_PERIOD register 111b, and the period-addition/subtraction module 18 are connected to an input side of the selector 14. The output from any of these three components may be selected in accordance with a control signal from a control module 21, and the stored value or the calculated value is supplied to the CUR_PERIOD register 16.

A value is set in the CUR_DUTY register 17 via a selector 15. The NEXT_DUTY register 112a, the NEXT_DUTY register 112b, and the duty-addition/subtraction module 19 are connected to an input side of the selector 15. The output of any of these three components is selected in accordance with a control signal from the control module 21, and the stored value or the calculated value is supplied to the CUR_DUTY register 17.

The control module 21 is also connected to the parameter-register module 11, the period-change quantity-calculation module 12, and the duty-change quantity-calculation module 13 in addition to the selectors 14 and 15, and the state of each module is managed, or the operation of each module is controlled, by sending various control signals from the control module 21. In addition, the control module 21 outputs an interrupt signal to a CPU (not shown in the FIG. 2) when a prescribed condition is met. Here, the control module 21 has a CUR register 211 that identifies whether a set value for generating the PWM signal in the present state is stored in either the register group 11a or 11b of the two register groups of the parameter-register 11.

Figure 3:
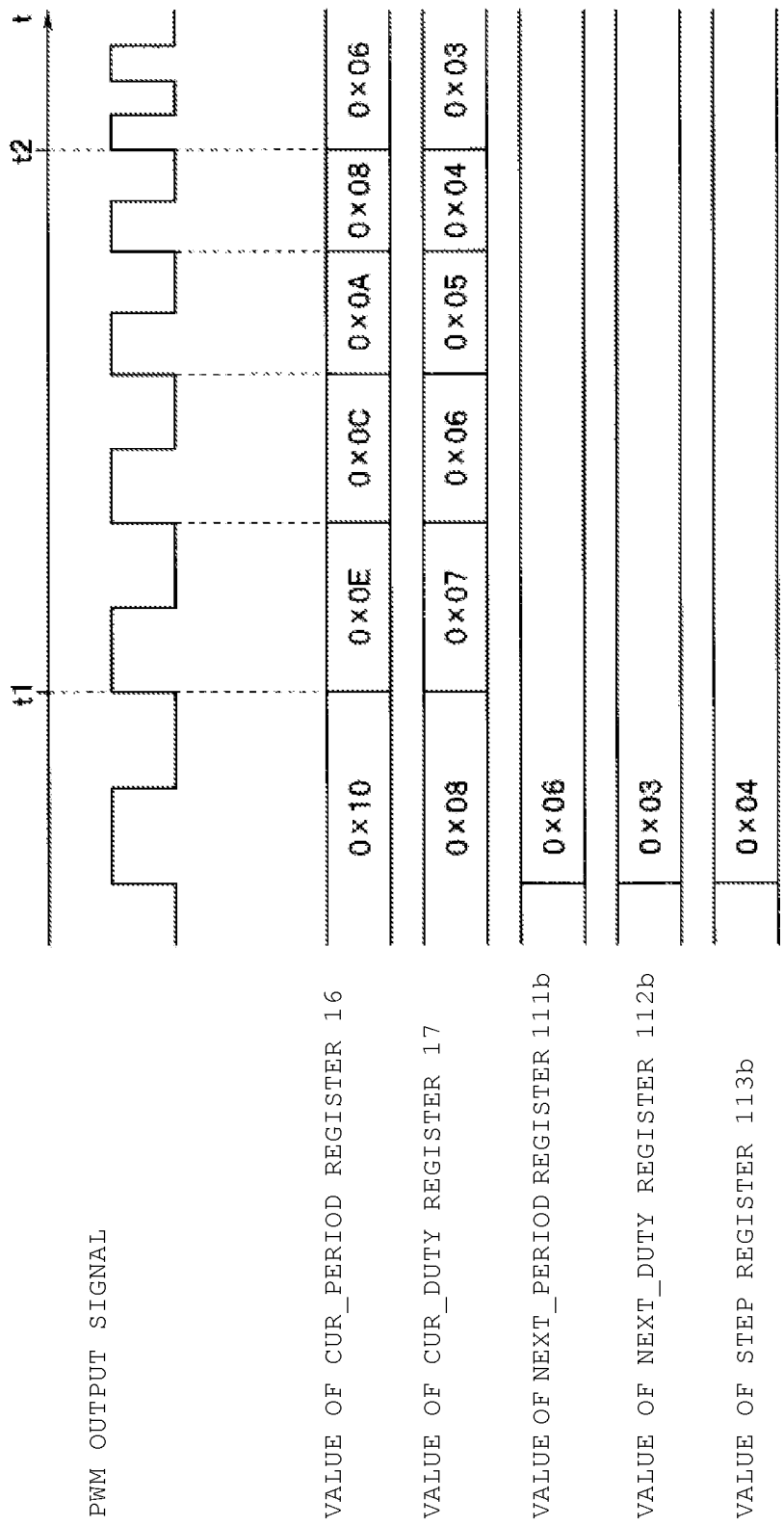
FIG. 3 is a timing chart depicting a relationship between a PWM output signal and the values stored in registers according to a first embodiment.

FIG. 3 is a time chart for explaining an example of the relationship between a PWM output signal from PWM signal generator 1 and the values stored in each register. Here, all of the values of each register in FIG. 3 are expressed using a hexadecimal notation.

In an initial state, no value is stored in any of the registers included in the parameter-register 11, the CUR_PERIOD register 16, and the CUR_DUTY register 17. If values are written (by, for example, the CPU) into the NEXT_PERIOD register 111a and the NEXT_DUTY register 112a of the first parameter-register group 11a, the selectors 14 and 15 are switched by the control module 21 so that the NEXT_PERIOD register 111a and the CUR_PERIOD register 16 are connected and the NEXT_DUTY register 112a and the CUR_DUTY register 17 are connected. Therefore, the value written into the NEXT_PERIOD register 111a is copied to the CUR_PERIOD register 16, and the value written into the NEXT_DUTY register 112a is copied to the CUR_DUTY register 17.

For example, in the case of an example shown in FIG. 3, if "0 x 10" is stored in the NEXT_PERIOD register 111a and "0 x 08" is stored in the NEXT_DUTY register 112a, these values are copied so that the value of the CUR_PERIOD register 16 becomes "0 x 10" and the value of the CUR_DUTY register 17 becomes "0 x 08."

If the value written into the NEXT_PERIOD register 111a is copied to the CUR_PERIOD register 16 and the value written into the NEXT_DUTY register 112a is copied to the CUR_DUTY register 17, the CUR register 211 of the control module 21 is set to a value showing the first parameter-register group 11a stores the parameters of the currently generated PWM signal. For example, if the value in the CUR register 211 indicating the first parameter-register group 11a is storing the current parameters of the PWM signal is "0", then a value of "0" is stored in the CUR register 211. Similarly, if the second parameter-register group 11b is storing the current parameters, then a value of "1" may be used to indicate this in the CUR register 211.

When values are stored in the CUR_PERIOD register 16 and the CUR_DUTY register 17, the PWM signal-output part 20 generates the PWM signal using the values.

When the PWM signal parameters are changed from the present state (current values) to another state (target state), the parameters for generating the PWM signal in another state are written (by, for example, the CPU) into each register of the second parameter-register group 11b. Specifically, the three parameters used for generating the target PWM signal are the target period and the target duty. Also required to make the transition from present state to target state is the step parameter (the number of periods in the transition period between present state and target state). Each of the three parameter values are written into the NEXT_PERIOD register 111b, the NEXT_DUTY register 112b, and the STEP register 113b, respectively.

For example, in the case of the example shown in FIG. 3, "0 x 06" is written into the NEXT_PERIOD register 111b, "0 x 03" is written into the NEXT_DUTY register 112b, and "0 x 04" is written into the STEP register 113b.

The writing of the values into the NEXT_PERIOD register 111b, the NEXT_DUTY register 112b, and the STEP register 113b is sequentially carried out. If the values are written into all three of the registers 111b, 112b, and 113b, the value of the UPDATE register 114b is set to a value indicating the setup of all of the registers is completed. For example, in case the value indicating a state in which the writing into all three of the registers 111b, 112b, and 113b from the CPU is completed is represented as "1" and the value showing a state in which there is a register that does not complete the writing is represented as "0," the value of the UPDATE register 114b is set to a range from "0" to "1."

If the value of the UPDATE register 114b is set to "1," (indicating an update has been stored) the values of the NEXT_PERIOD register 111a, the NEXT_PERIOD register 111b, and the STEP register 113b are copied to the period-change quantity-calculation module 12. Using these values, the amount of change in the period length per period in the transition period is calculated in the period-change quantity-calculation module 12. Specifically, the amount of change in the period length per one period (step) in the transition period is calculated using the following expression (1):

$$((\text{target period length}) - (\text{present period length}))/((\text{the number of periods in the transition period}) + 1).$$

In the example shown in FIG. 3, the target period length is the value (=6) in the NEXT_PERIOD register 111b, the present period length is the value (=16) in the NEXT_PERIOD register 111a, and the number of periods in the transition period is the value (=4) in the STEP register 113b. Therefore, if these numerical values are substituted into the expression (1) and calculated, the amount of change in the period length of the PWM signal per one period is $(6-16)/(4+1)=(-10)/5=-2$. The amount of change in the period length of the PWM signal per one period of the transition period is calculated in the period-change quantity-calculation module 12 and output to the period-addition/subtraction module 18 as a period-calculation module.

Here, whether the present period length is stored in the NEXT_PERIOD register 111a or 111b or is given to the period-change quantity-calculation module 12 is determined by a control signal from the control module 21. The control module identifies the register in which the present period parameter is stored with reference to the value of the CUR register 211. In the above example, because the value of the CUR register 211 is set to "0," it is identified that the present state parameters are stored in the first parameter-register group 11a. Therefore, the control module 21 informs the period-change quantity-calculation module 12 that the register in which the present period length is stored is the NEXT_PERIOD register 111a.

In addition, if the value of the UPDATE register 114b is set to "1," the values of the NEXT_DUTY register 112a, the NEXT_DUTY register 112b, and the STEP register 113b are copied in the duty-change quantity-calculation module 13. Using these values, the amount of change of the duty per one period of a transition period from the present value to a target value is calculated in the duty-change quantity-calculation module 13. Specifically, the amount of change in the duty per one period is calculated using the following expression (2):

$$((\text{target duty}) - (\text{present duty}))/((\text{the number of periods in the transition period}) + 1).$$

In the example shown in FIG. 3, the target duty is the value (=3) of the NEXT_DUTY register 112b, the present duty is the value (=8) of the NEXT_DUTY register 112a, and the number of periods in the transition period is the value (=4) of the STEP register 113b. Therefore, if these numerical values are substituted into the expression (2) and calculated, the amount of change of the duty of the PWM signal per one period of the transition period is $(3-8)/(4+1)=(-5)/5=-1$. The amount of change of the duty of the PWM signal per period is calculated in the duty-change quantity-calculation module 13 and output to the duty-addition/subtraction module 19 as a duty-calculation module.

Here, whether the present duty is stored in the NEXT_DUTY register 112a or 112b or is given to the duty-change quantity-calculation module 13 is determined by a control signal from the control module 21.

Next, in the case where the value of the UPDATE register 114b is set to "1," when the output of the waveform of the outputting PWM signal is completed, a control signal is output to the selector 14 from the control module 21, and switching is carried out so that the output from the period-addition/subtraction module 18 is input into the CUR_PERIOD register 16. Similarly, in the case where the value of the UPDATE register 114b is set to "1," when the output of the waveform of the outputting PWM signal is completed, a control signal is also output to the selector 15 from the control module 21, and switching is carried out so that the output from the duty-addition/subtraction module 19 is input into the CUR_DUTY register 17. In the example shown in FIG. 3, the above switching is carried out at time t1.

If switching is carried out, the value in which the amount of change of the period of the PWM signal per one period is added to the previous period (the value of the =CUR_PERIOD register 16) of the PWM signal is output to the CUR_PERIOD register 16 via the selector 14 from the period-addition/subtraction module 18. In the example shown in FIG. 3, because the previous period of the PWM signal is "0 x 10" and the amount of change of the period length of the PWM signal per one period is "-2," the value in which "-2" is added to "0 x 10," that is, "0 x 0E," is output to the CUR_PERIOD register 16 from the period-addition/subtraction calculation module 18.

In the same manner, the value in which the amount of change of the duty of the PWM signal per one period is added to the previous duty (the value of the CUR_PERIOD register 17) of the PWM signal is output to the CUR_DUTY register 17 via the selector 15 from the duty-addition/subtraction module 19. In the example shown in FIG. 3, because the previous duty of the PWM signal is "0 x 08" and the amount of change of the duty of the PWM signal per one period is "−1," the value of "−1" added to "0 x 08," that is, "0 x 07," is output to the CUR_DUTY register 17 from the duty-addition/subtraction calculation module 19. The PWM signal-output module 20 generates a PWM signal using the values of registers 16 and 17. In other words, the PWM signal, which is generated right after switching at the time t1, is a PWM signal with a waveform in which the period is "0 x 0E" and the duty is "0 x 07."

After switching at time t1, the PWM signal with the same number of periods as the set value of the STEP register 113b is generated and output in the PWM signal-output module 20 using the value of the period parameters calculated in the period-addition/subtraction module 18 (and input into the CUR_PERIOD register 16) and the value of the duty calculated in the duty-addition/subtraction module 19 (and input into the CUR_DUTY register 17).

In the example shown in FIG. 3, because the set value of the STEP register 113b is "4," the four periods after switching (at time t1) are the transition period (the period from t1 to t2 in FIG. 3) during which the present set value is changed to a target set value. The period and the duty of the PWM signal at the first period are "0 x 0E" and "0 x 07" as mentioned above. The period (the value of the CUR_PERIOD register 16) of the PWM signal at the second period is a value in which "−2" is added to "0 x 0E" as a value of the previous period, that is, "0 x 0C," and the duty (the value of the CUR_DUTY register 17) is a value in which "−1" is added to "0 x 07", that is, "0 x 06."

At the third period and the fourth period, similarly, values in which the amounts of change are added to the values of the previous period and duty are used. In other words, the period (the value of the CUR_PERIOD register 16) of the PWM signal at the third period and the fourth period is "0 x 0A" and "0 x 08," respectively. In addition, the duties (the values of the CUR_DUTY register 17) of the PWM signal at the third period and the fourth periods are "0 x 05" and "0 x 04," respectively.

When the output of the waveform of the PWM signal of the last period in the transition period is completed, a control signal is output to the selector 14 from the control module 21, and switching is carried out so that the output from the NEXT_PERIOD register 111b (which is storing the target value in this example) is input into the CUR_PERIOD register 16. Similarly, when the output of the waveform of the PWM signal of the last period in the transition period is completed, a control signal is also output to the selector 15 from the control module 21, and switching is carried out so that the output from the NEXT_DUTY register 112b (which is storing the target value in this example) is input into the CUR_DUTY register 17. In the example shown in FIG. 3, the above switching is carried out at the time t2.

In other words, for the period from the start of the operation of the PWM signal generator 1 until the time t1, the PWM signal is generated using the value of the first parameter-register group 11a written from the CPU. The period from the time t1 to t2 is a transition period from the value (present state) of the first parameter-register group 11a to the value (target state) of the second parameter-register group 11b. Within this period, the period length and the duty that are used in the generation of the PWM signal are calculated in the PWM signal generator 1 using the value of the first parameter-register group 11a and the value of the second parameter-register group 11b. At the time t2, the PWM signal reaches a target state, and the PWM signal is generated using the value of the second parameter-register group 11b written from the CPU.

If the value written into the NEXT_PERIOD register 111b is copied to the CUR_PERIOD register 16 and the value written into the NEXT_DUTY register 112b is copied to the CUR_DUTY register 17, the CUR register 211 of the control module 21 is set to a value showing the second parameter-register group 11b is now storing the present signal parameters. For example, in case the value showing the first parameter-register group 11a is registered as "0" and the value showing the second parameter-register group 11b is registered as "1," the value of the CUR register 211 is set to "1."

In addition, the value of the UPDATE register 114a of the first parameter-register group 11a (as a register group in which a target state is set next) becomes a value showing a state in which the setup is incomplete. For example, in case the value showing a state in which the writing to all three of the registers 111a, 112a, and 113a of the parameter group from the CPU is completed is registered as "1" and the value showing a state in which there is an incomplete register of the write is registered as "0," the value of the UPDATE register 114a is set to "0."

Moreover, an interrupt signal is output to the CPU from the control module 21. Here, outputting the interrupt signal is a signal indicating that the parameters (period, duty, and the number of periods in a transition from the present state to a target state) of the next target state can be written into the first parameter-register group 11a. After receiving the interrupt signal, if the PWM signal is required to be changed from the present state to a different state, the CPU writes the parameters (target values) required for generating the desired PWM signal to the first parameter-register group 11a.

In this manner, each time the PWM signal is required to be changed from the present state to another state, the CPU carries out the writing to the register group in which the parameters in the present state are stored and the parameters of a target state can be written to one of the two register groups 11a and 11b of the parameter-register group 11, the values (period, duty) of the parameters that are used for the generation of the PWM signal during a transition period are automatically generated in the PWM signal generator using the values written into the two register groups 11a and 11b, and the waveform of the PWM signal is changed from the present state to the target state in incremental steps.

As mentioned above, according to this embodiment, in case the PWM signal is changed from the present state to another state, the values of the period and the duty of the PWM signal that is generated for a transition period can be automatically calculated from the period and the duty that are used in the generation of the PWM signal in the present state, the period and the duty that are used in the generation of the PWM signal in another state (target state), and the number of periods (steps) in the desired transition period (the number of waveforms of the generating PWM signal). Therefore, because the parameters of the PWM signal that is generated for each step of the transition period are not required to be sequentially written into the PWM signal generator from the CPU, the load of the CPU can be decreased.

Here, in the above example, the parameter-register group 11 for storing the parameters that are used in the generation of a PWM signal is composed of two register groups of the first parameter-register group 11a and the second parameter-register group 11b; however, the parameter-register group for storing the parameters that are used in the generation of the PWM signal may be composed of three or more parameter-register groups.

In addition, a value indicating the register group in which the parameters for generating the PWM signal in the present state are stored is written in the CUR register 211 that is in the control module 21; however, a value indicating the register group in which the parameters for generating the PWM signal in a target state are stored may be written to a register in the control module. Moreover, two registers may be installed to identify both the register in which the parameters for generating the PWM signal in the present state are stored and the register in which the parameters for generating the PWM signal in a target state are stored.

Furthermore, in the above example, the PWM signal generated in the PWM signal generator is used in driving the backlights of a liquid crystal panel and the driving of a motor; however, the PWM signal generator of this embodiment can also be applied to the driving of other parts using a PWM signal.

Second Embodiment

In the PWM signal generator 1 of the first embodiment mentioned above, each time the waveform of a PWM signal is required to be changed from the present state to another state, the parameters for generating the PWM signal in a target state are written into the PWM signal generator from the CPU. However, in a second embodiment, the parameters for generating a PWM signal in a target state are also written in advance, and the waveform of the PWM signal is automatically transitioned from the present state to the target state without additional input from the CPU. In a PWM signal generator 1' according to a second embodiment, the configuration of the registers constituting a first parameter-register group 11'a and a second parameter-register group 11'b of a parameter-register group 11' and a control group 21' is different from the configuration according to the first embodiment. Other constituent elements that are the same as the constituent elements of the first embodiment are given the same reference symbols, and their explanation may be omitted.

Figure 4:
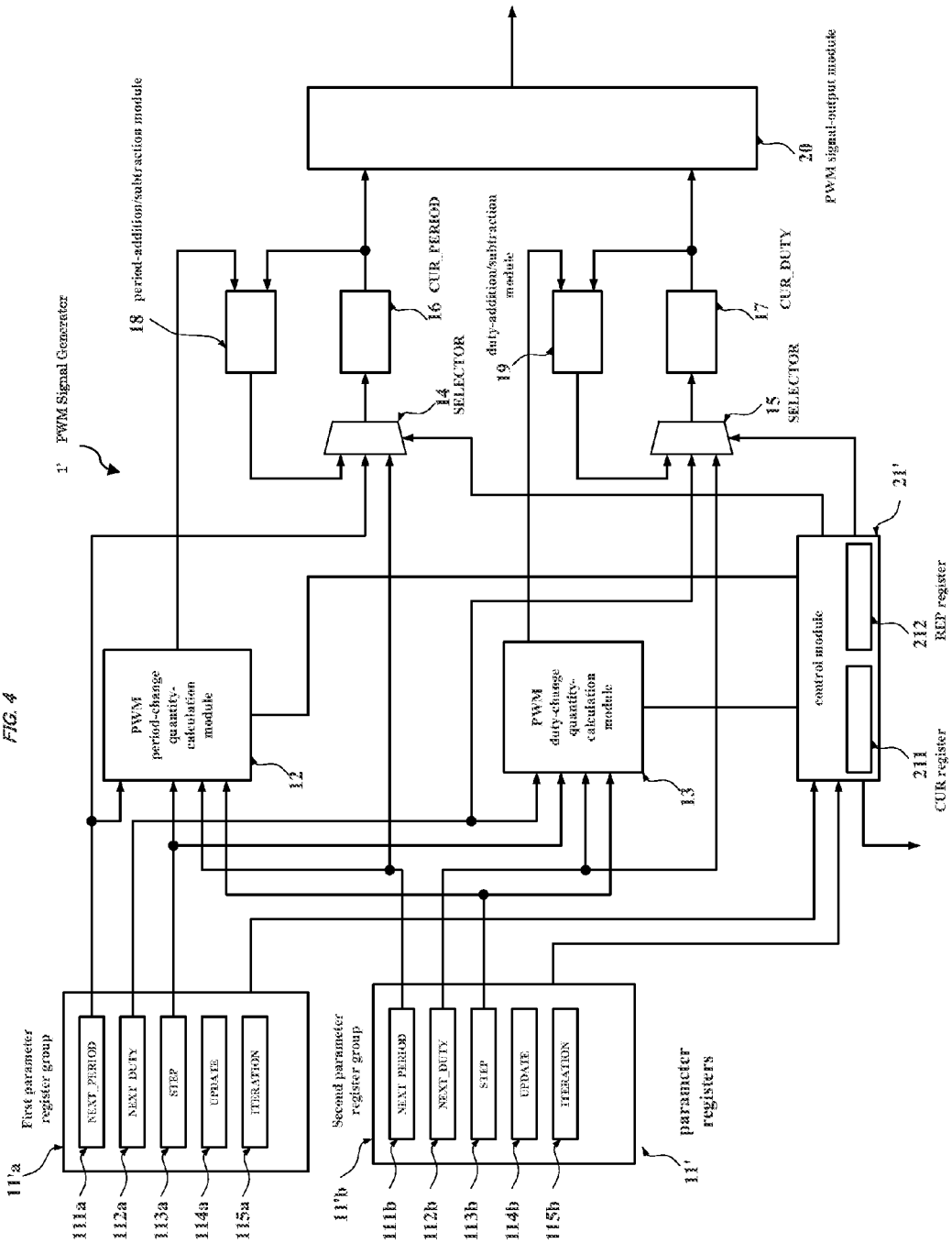
FIG. 4 is a block diagram depicting a configuration of a PWM signal generator according to a second embodiment.

FIG. 4 is a block diagram depicting the configuration of a PWM signal generator according to a second embodiment. As shown in FIG. 4, the parameter-register group 11' of the PWM signal generator 1' is composed of the first parameter-register group 11'a and the second parameter-register group 11'b. The first parameter-register group 11'a is provided with an ITERATION register 115a in addition to the NEXT_PERIOD register 111a, the NEXT_DUTY register 112a, the STEP register 113a, and the UPDATE register 114a.

The ITERATION register 115a, is a first repetitive period register and stores a number of periods for which a PWM signal is generated using values written into the register group 11'a (a PWM signal that is generated using the values of the NEXT_PERIOD register 111a and the NEXT_DUTY register 112a). That is, the ITERATION register 115a stores a parameter indicating for how many periods a PWM waveform having the period length and duty indicated in NEXT_PERIOD register 111a and NEXT_DUTY register 112a, respectively, is to be repeated.

Similarly to the first parameter-register group 11'a, the second parameter-register group 11'b is also provided with an ITERATION register 115b in addition to the NEXT_PERIOD register 111b, the NEXT_DUTY register 112b, the STEP register 113b, and the UPDATE register 114b. The ITERATION register 115b is a second repetitive period register that stores a number of periods for which a PWM signal is generated using values written into the same register group 11'b (a PWM signal that is generated using the values of the NEXT_PERIOD register 111b and the NEXT_DUTY register 112b).

In addition, the control module 21' is provided with a REP register 212 as a repeat flag in addition to the CUR register 211. The REP register 212 is a register for identifying whether the generation of the PWM signal using the first parameter-register group 11'a and the generation of the PWM signal using the second parameter-register group 11'b are to be automatically repeated. A value of "0" or "1," for example, can be set in the REP register 212. For example, if "1" is set, a mode for automatically repeating the generation of the PWM signal using the first parameter-register group 11'a and the generation of the PWM signal using the second parameter-register group 11'b is indicated. The other elements of the PWM signal generator 1' are the same as the elements of the first embodiment explained with reference to FIG. 2.

In the PWM signal generator 1' the operation when the generation of the PWM signal using the first parameter-register group 11'a and the generation of the PWM signal using the second parameter-register group 11'b is automatically repeated may be explained with reference to FIG. 5. FIG. 5 is a time chart depicting an example of the relationship between a PWM output signal of the second embodiment and the values stored in each register. Here, all of the values of each register in FIG. 5 are expressed using a hexadecimal notation.

In an initial state, no value is set in each register, which is included in the parameter-register 11', the CUR_PERIOD register 16, and the CUR_DUTY register 17. In this state, first, the parameters required for generating a desired PWM signal are written into the NEXT_PERIOD register 111a, the NEXT_DUTY register 112a, the STEP register 113a, and the ITERATION register 115a of the first parameter-register group 11'a from the CPU. In addition, the parameters required for generating a desired target PWM signal are written into the NEXT_PERIOD register 111b, the NEXT_DUTY register 112b, the STEP register 113b, and the ITERATION register 115b of the second parameter-register group 11'b from the CPU.

If the writing of the values into the parameter-register 11' from the CPU is completed, the selectors 14 and 15 are switched by the control module 21' so that the NEXT_PERIOD register 111a and the CUR_PERIOD register 16 are connected and the NEXT_DUTY register 112a and the CUR_DUTY register 17 are connected. Therefore, the value written into the NEXT_PERIOD register 111a is copied in the CUR_PERIOD register 16, and the value written into the NEXT_DUTY register 112a is copied to the CUR_DUTY register 17.

For example, in the case of the example shown in FIG. 5, if "0 x 10" is written into the NEXT_PERIOD register 111a and "0 x 08" is written into the NEXT_DUTY register 112a, these values are copied so that the value of the CUR_PERIOD register 16 becomes "0 x 10" and the value of the CUR_DUTY register 17 becomes "0 x 08."

If the value written into the NEXT_PERIOD register 111a is copied to the CUR_PERIOD register 16 and the value written into the NEXT_DUTY register 112a is copied to the CUR_DUTY register 17, the CUR register 211 of the control module 21' is set to a value indicating the first parameter-register group 11'a is storing the present parameters. For example, in case the value indicating the first parameter-register group 11'a is "0" and the value indicating the second parameter-register group 11'b is "1," the value of the CUR register 211 is set to "0." In addition, the REP register of the control module 21' is set to "1," indicating a repeat mode is enabled.

If values are set in the CUR_PERIOD register 16 and the CUR_DUTY register 17, the PWM signal-output part 20 generates the PWM signal using the values of these registers 16 and 17. If the PWM signal is generated according to the parameters stored in the first parameter-register group 11'a for the number of periods set in the ITERATION register 115a, a transition to the target values stored in the second parameter-register group 11'b is begun. In the case of the example in FIG. 5, because the set value of the ITERATION register 115a is "0 x 02," when the generation of the PWM signal with the period length and duty parameters stored in first parameter-register group 11'a has been performed for two periods, the transition to a target state is automatically started (at time t1' in FIG. 5).

The parameters in the target state are values written into the second parameter-register group 11'b. The transition between present state and target state is similar to the transition of the first embodiment. In other words, in the period-change quantity-calculation module 12, the difference between the NEXT_PERIOD register 111b as a target parameter and the NEXT_PERIOD register 111a as a present state parameter is divided by the value in the STEP register 113b plus 1 (see expression (1)) to calculate the amount of change in period length per one period for the transition period.

In the duty-change quantity-calculation module 13, the difference between the NEXT_DUTY register 112b as a target state parameter and the NEXT_DUTY register 112a as a present state parameter is divided by the value in the STEP register 113b plus 1 (see expression (2)) to calculate the amount of change in the duty value per one period for the transition period.

In the example shown in FIG. 5, because the set value of the NEXT_PERIOD register 111b is "0 x 06," the set value of the NEXT_DUTY register 112b is "0 x 03," and the set value of the STEP register 113b is "0 x 04," the amount of change of the period value is "−2," and the amount of change of the duty value is "−1."

In the PWM signal that is generated during the transition period, values in which the amount of change of the period value and the amount of change of the duty value calculated are added and subtracted to and from the parameters of the period and the duty used in the generation of the previous PWM signal. In the example in FIG. 5, for the four periods as a transition period from the time t1', a value in which "−2" is added to the period used in the generation of the previous PWM signal is adopted as the period of the next PWM signal in the transition period, and a value in which "−1" is added to the duty used in the generation of the previous PWM signal is adopted as the duty of the next PWM signal in the transition period.

Therefore, as shown in FIG. 5, the PWM signal, which starts the period from the time t1', has a period of "0 x 0E" and a duty of "0 x 07," and the PWM signal of the next period has a period of "0 x 0C" and a duty of "0 x 06." The PWM signal of the third period has a period of "0 x 0A" and a duty of "0 x 05," and the PWM signal of the last period of the transition period as the fourth period has a period of "0 x 08" and a duty of "0 x 04."

If the generation of the PWM signal of the last period of the transition period is completed (time t2' of FIG. 5), the CUR register 211 showing the present state is set to a value indicating the second parameter-register group 11'b is storing the present parameters of the PWM signal.

Next, for the number of periods written into the ITERATION register 115b, the PWM signal is generated using the second parameter-register group 11'b. In the case of an example shown in FIG. 5, because the value of the ITERATION register 115b is "0 x 03," the PWM signal is generated using the second parameter-register group 11'b for three periods.

After the generation of the PWM signal for the three periods is completed using the second parameter-register group 11'b, the transition to a target state is automatically started (time t3' of FIG. 5). The parameters in the next target state can be values written into each register of the first parameter-register group 11'a. The transition method of the period and the duty for generating the PWM signal from the present state to the target state is similar to the above method (the transition method for the period from the time t1' to the time t2'). Here, the number of transition periods in this case is a set value of the STEP register 113a. In the example shown in FIG. 5, the value is "0 x 04," that is, 4 periods.

If the generation of the PWM signal of the last period of the transition period is completed (time t4' of FIG. 5), the CUR register 211 is set to a value indicating the present state parameters are stored in first parameter-register group 11'a.

Next, for the number of periods written into the ITERATION register 115a, the PWM signal is generated using the first parameter-register group 11'a. In the case of an example shown in FIG. 5, because the value of the ITERATION register 115a is "0 x 02," the PWM signal is generated in the present state (the state in which the PWM signal is generated using the first parameter-register group 11'a) for 2 periods. From the moment when the generation of the PWM signal for 2 periods is completed using the first parameter-register group 11'a, the transition to the target state is automatically started (t5' of FIG. 5).

In this manner, using the values written into the first parameter-register group 11'a and the second parameter-register group 11'b from the CPU, the waveform of the PWM signal can be automatically and repeatedly changed.

Therefore, according to this embodiment, using the values written into the first parameter-register group 11'a and the second parameter-register group 11'b from the CPU, the waveform of a PWM signal can be automatically changed from a first state to a second state and from the second state to the first state. The period and the duty of the PWM signal, which is generated for a transition period from one state to the other state, can also be automatically calculated using the values written into the parameter-register 11'. Therefore, because the waveform of the PWM signal can be automatically and repeatedly changed simply by writing the values once into the PWM signal generator from the CPU, the load of the CPU can be further reduced.

Here, in the above example, in a state in which the value of the REP register is set to "1," the waveform of the PWM signal is automatically and repeatedly changed from the first state to the second state and from the second state to the first state; however, the repetition can be automatically stopped by switching the value of the REP register to "0" at an arbitrary timing.

For example, the case where the value of the REP register is switched to "0" for the period in which a PWM signal is generated using the first parameter-register group 11'a will be explained. In case the values in the next state are written into the NEXT_PERIOD register 111b, the NEXT_DUTY register 112b, and the STEP register 113b of the second parameter-register group 11'b from the CPU and the value of the UPDATE register 114b is set to a value showing a state in which the writing of all of the registers is completed, when the generation of the PWM signal for the number of periods written into the ITERATION register 115a is completed, the transition period is transited to a target state written into the second parameter-register group 11'b.

Here, using the first parameter-register group 11'a, the value of the REP register is switched to "0" for the period in which the PWM signal is generated. In case the writing of each register of the second parameter-register group 11'b is not completed until the completion of the generation of the PWM signal for the number of periods written into the ITERATION register 115a and the value of the UPDATE register 114b is set to a value showing a state in which the writing of the registers is not completed, the generation of the PWM signal may be finished when the generation of the PWM signal for the number of periods set in the ITERATION register 115a is completed. Or, regardless of the number of periods written into the ITERATION register 115a, the PWM signal may be continuously generated using the parameters in the present state until the writing of each register of the second parameter-register group 11'b is completed.

In addition, each register of the parameter-register 11', if necessary, can be rewritten at any time from the CPU. For example, in the example shown in FIG. 5, if the value of the ITERATION 115a is rewritten from "0 x 02" to other values such as "0 x 05" for the period from the time t1' to the time t4', then the period in which the PWM signal is generated can be changed to another number of periods, such as 5 periods, after the time t4' by the first parameter-register group 11'a.

Here, in this embodiment, the parameter-register groups constituting the parameter-register group 11' for storing the parameters that are used in the generation of a PWM signal are only two but additional parameter-register groups may be included such that there may also be three or more parameter-register groups.

Moreover, in the CUR register 211 installed in the control module 21', a value showing a register group in which the parameters for generating the PWM signal in the present state are stored is set; however, a value showing a register group in which the parameters for generating the PWM signal in a target state are stored may be set. Furthermore, two registers may be installed to identify both a register for identifying the register group in which the parameters for generating the PWM signal in the present state are stored and a register in which the parameters for generating the PWM signal in the target state are stored.

In addition, in the above example, the PWM signal generated in the PWM signal generator may be used in, for example, driving the backlights of a liquid crystal panel and the driving of a motor; however, the PWM signal generator of this embodiment can also be applied by connecting it to other driving parts using the PWM signal.

Each "part" or "module" in this specification is a concept corresponding to each function of the embodiments and is not always a one-to-one correspondent to a specific hardware or software routine. Therefore, in this specification, the embodiments have been explained assuming a virtual circuit block having each noted function or operation.

While certain embodiments have been described, these embodiments have been presented by way of example only and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pulse width modulated signal generator, comprising:
    a period-change quantity-calculation module configured to calculate an amount of change in a period parameter of an output signal during a transition period between an output of a first signal waveform and an output of a second signal waveform using a first period parameter of the first signal waveform, a second period parameter of the second signal waveform, and a transition-period parameter indicating a predetermined number of steps in the transition period;
    a duty-change quantity-calculation module configured to calculate an amount of change in a duty ratio of the output signal during the transition period using a first duty parameter of the first signal waveform, a second duty parameter of the second signal waveform, and the transition-period parameter;
    a period-calculation module configured to calculate the period parameter for the output signal using the calculated amount of change in the period parameter of the output signal during the transition period; and
    a duty-calculation module configured to calculate the duty ratio for the output signal using the calculated amount of change in the duty ratio of the output signal during the transition period.

2. The pulse width modulated signal generator according to claim 1, further comprising:
    a first period register configured to store the first period parameter;
    a first duty register configured to store the first duty parameter;
    a second period register configured to store the second period parameter;
    a second duty register configured to store the second duty parameter;
    a first transition-period register configured to store a first transition-period parameter indicating a predetermined number of steps in the transition period between output of the second signal waveform and output of the first signal waveform; and
    a second transition-period register configured to store a second transition-period parameter indicating a predetermined number of steps in the transition period between output of the first signal waveform and output of the second signal waveform.

3. The pulse width modulated signal generator according to claim 2, further comprising:
    a control module configured to select an output of the first period register and an output of the first duty register when the first signal waveform is to be generated, select an output of the second period register and an output of the second duty register when the second signal waveform is to be generated, and select an output of the period-calculation module and an output of the duty-calculation module during the transition period.

4. The pulse width modulated signal generator according to claim 3, further comprising:
    a first setup completion flag indicating whether parameter values have been completely stored in the first period register, the first duty register, and the first transition-period register; and
    a second setup completion flag indicating whether parameter values have been completely stored in the second period register, the second duty register, and the second transition-period register.

5. The pulse width modulated signal generator according to claim 1, wherein the period-change quantity-calculation module is configured to calculate the amount of change in the period parameter of the output signal by dividing the difference between the first period parameter and the second period parameter by a value obtained by adding 1 to the transition-period parameter.

6. The pulse width modulated signal generator according to claim 1, wherein the duty-change quantity-calculation module is configured to calculate the amount of change in the duty ratio of the output signal by dividing the difference between the first duty parameter and the second duty parameter by a value obtained by adding 1 to the transition-period parameter.

7. The pulse width modulated signal generator according to claim 1, further comprising:
an iteration register configured to store an iteration parameter indicating a number of periods the first signal waveform or the second signal waveform will be repeated.

8. The pulse width modulated signal generator according to claim 1, further comprising:
a first register group configured to store values for the first period parameter, the first duty parameter, and a first transition-period parameter indicating a predetermined number of steps in the transition period between output of the second signal waveform and output of the first signal waveform;
a second register group configured to store values for the second period parameter, the second duty parameter, and a second transition-period parameter indicating a predetermined number of steps in the transition period between output of the first signal waveform and output of the second signal waveform; and
a control module configured to detect when new values are stored either of the first register group and second register.

9. The pulse width modulated signal generator according to claim 8, wherein the period parameter and the duty ratio of the output signal is not changed until new values are stored in one of the first register group and the second register group.

10. The pulse width modulated signal generator according to claim 1, wherein the output signal is supplied to a liquid crystal display or a direct current motor.

11. A pulse width modulated signal generator, comprising:
a period-change quantity-calculation module configured to calculate an amount of change in a period parameter of an output signal waveform during a transition period between output of an initial signal waveform and output of a target signal waveform using an initial period parameter of the initial signal waveform, a target period parameter of the target signal waveform, and a transition-period parameter indicating a predetermined number of steps in the transition period;
a duty-change quantity-calculation module configured to calculate an amount of change in a duty ratio of the output signal waveform during the transition period using an initial duty parameter of the initial signal waveform, a target duty parameter of the target signal waveform, and the transition-period parameter;
a period-calculation module configured to calculate the period parameter for the output signal using the calculated amount of change in the period parameter of the output signal during the transition period;
a duty-calculation module configured to calculate the duty ratio for the output signal waveform using the calculated amount of change in the duty ratio of the output signal waveform during the transition period;
a transition-period register configured to store a transition-period parameter indicating a predetermined number of steps in the transition period between output of the initial signal waveform and output of the target signal waveform; and
a control module configured to set the period parameter and the duty ratio of the output signal waveform during the transition period using output of the period-calculation module and the duty-calculation module, respectively.

12. The pulse width modulated signal generator according to claim 11, further comprising:
an initial period register configured to store the initial period parameter;
an initial duty register configured to store the initial duty parameter;
a target period register configured to store the target period parameter; and
a target duty register configured to store the target duty parameter.

13. The pulse width modulated signal generator according to claim 12, further comprising:
a setup completion flag register indicating whether values have been stored in the target period register, the target duty register, and the transition-period register.

14. The pulse width modulated signal generator according to claim 11, wherein
the amount of change in the period parameter of the output signal waveform is calculated by dividing the difference between the initial period parameter and the target period parameter by a value obtained by adding 1 to the transition-period parameter, and
the amount of change in the duty ratio of the output signal waveform is calculated by dividing the difference between the initial duty parameter and the target duty parameter by the value obtained by adding 1 to the transition-period parameter.

15. The pulse width modulated signal generator according to claim 14, wherein the period parameter of the output signal in each step in the transition period is equal to the period parameter used in a previous step adjusted by the amount of change calculated by the period-change quantity calculation module.

16. The pulse width modulated signal generator according to claim 11, wherein the control module is further configured to set the period parameter and duty ratio of the output signal waveform after the transition period to the target period parameter and the target duty parameter for a predetermined number of periods of the output signal.

17. A method of generating pulse width modulated signal, comprising:
outputting an output signal having a period length and a duty ratio based on a first signal waveform having a first period parameter and a first duty parameter;
receiving a second period parameter and a second duty parameter of a second signal waveform;
calculating an amount of change in the period length of the output signal that is to be output during a transition period between an output of the first signal waveform and an output of the second signal waveform, using the first period parameter, the second period parameter, and a transition-period parameter indicating a predetermined number of steps in the transition period;
calculating an amount of change in the duty ratio of the output signal that is to be output during the transition period, using the first duty parameter, the second duty parameter, and the transition-period parameter;
during the transition period, outputting the output signal having a period length changed according to the calculated amount of change in the period length and a duty ratio changed according to the calculated amount of change in the duty ratio; and after the transition period, outputting an output signal having a period length and a duty ratio based on the second signal waveform.

18. The method of claim 17, wherein the period length of the output signal during each step in the transition period is based on the period parameter of the output signal during a previous step or the first period parameter.

19. The method of claim 17, wherein the output signal having a period length and a duty ratio based on the second signal waveform is repeated for a predetermined number of periods after the transition period.

20. The method of claim 17, wherein the output signal is supplied to a backlight of a liquid crystal display or a direct current motor.

* * * * *